US012155169B2

United States Patent
Watkins et al.

(10) Patent No.: US 12,155,169 B2
(45) Date of Patent: Nov. 26, 2024

(54) LIGHT EMITTING MODULE INCLUDING ENHANCED EYE-SAFETY FEATURE

(71) Applicant: ams Sensors Asia Pte. Ltd., Singapore (SG)

(72) Inventors: Laurence Watkins, Pennington, NJ (US); Maik Scheller, Redmond, WA (US); Baiming Guo, Old Bridge, NJ (US); Qing Wang, Plainsboro, NJ (US); Peng Gao, Eindhoven (NL)

(73) Assignee: AMS SENSORS ASIA PTE. LTD., Singapore (SG)

( * ) Notice: Subject to any disclaimer, the term of this patent is extended or adjusted under 35 U.S.C. 154(b) by 620 days.

(21) Appl. No.: 17/283,855

(22) PCT Filed: Dec. 9, 2019

(86) PCT No.: PCT/SG2019/050603
§ 371 (c)(1),
(2) Date: Apr. 8, 2021

(87) PCT Pub. No.: WO2020/122815
PCT Pub. Date: Jun. 18, 2020

(65) Prior Publication Data
US 2021/0384703 A1 Dec. 9, 2021

Related U.S. Application Data

(60) Provisional application No. 62/777,339, filed on Dec. 10, 2018.

(51) Int. Cl.
*H01S 5/00* (2006.01)
*H01S 5/02257* (2021.01)
(Continued)

(52) U.S. Cl.
CPC .......... *H01S 5/005* (2013.01); *H01S 5/02257* (2021.01); *H01S 5/06808* (2013.01); *H01S 5/06825* (2013.01); *H01S 5/423* (2013.01)

(58) Field of Classification Search
CPC ... H01S 5/02257; H01S 5/005; H01S 5/06825
See application file for complete search history.

(56) References Cited

U.S. PATENT DOCUMENTS

2011/0274131 A1* 11/2011 Takaki ............... H01S 5/423
372/50.124
2016/0290856 A1* 10/2016 Fiederling ............ F21S 45/70
(Continued)

FOREIGN PATENT DOCUMENTS

CN 107608167 A 1/2018
CN 108388072 A 8/2018
(Continued)

OTHER PUBLICATIONS

International Search Report with Written Opinion for related Application No. PCT/SG2019/050603 dated Feb. 11, 2020 (11 Pages).
(Continued)

*Primary Examiner* — Michael Carter
(74) *Attorney, Agent, or Firm* — VIERING, JENTSCHURA & PARTNER mbB

(57) ABSTRACT

An apparatus includes a light source operable to produce light having a wavelength, an optical component disposed over the light source so as to intersect a path of light produced by the light source, and at least one electrically conductive trace on a surface of the optical component. A drive controller is operable to regulate optical output power of the light source. The at least one electrically conductive trace is coupled electrically to the drive controller, which is operable to monitor an electrical characteristic of the at least one electrically conductive trace, and to reduce the optical (Continued)

output power of the light source if a value of the electrical characteristic is indicative of a possible eye-safety hazard.

21 Claims, 8 Drawing Sheets

(51) Int. Cl.
*H01S 5/068* (2006.01)
*H01S 5/42* (2006.01)

(56) References Cited

U.S. PATENT DOCUMENTS

| | | | |
|---|---|---|---|
| 2018/0119897 A1* | 5/2018 | Vogt | H01S 5/0087 |
| 2019/0199052 A1* | 6/2019 | Miyoshi | H01S 5/06825 |

FOREIGN PATENT DOCUMENTS

| | | | |
|---|---|---|---|
| CN | 108767643 A | * | 11/2018 |
| CN | 108832475 A | * | 11/2018 |
| CN | 208157409 U | | 11/2018 |
| CN | 208157410 U | | 11/2018 |
| EP | 3 474 392 A1 | | 4/2019 |
| WO | 2016/147759 A1 | | 9/2016 |
| WO | 2019/152462 A1 | | 8/2019 |

OTHER PUBLICATIONS

International Preliminary Report on Patent ability for related Application No. PCT/SG2019/050603 dated Jun. 24, 2021 (9 Pages).
Search report issued for corresponding Chinese patent application No. 2019800774412, dated Jul. 28, 2023, 2 pages (for informational purposes only).
Chinese Office Action issued for the corresponding CN patent application No. CN 201980077441.2 dated Aug. 28, 2024, 16 pages (For informational purposes only).

* cited by examiner

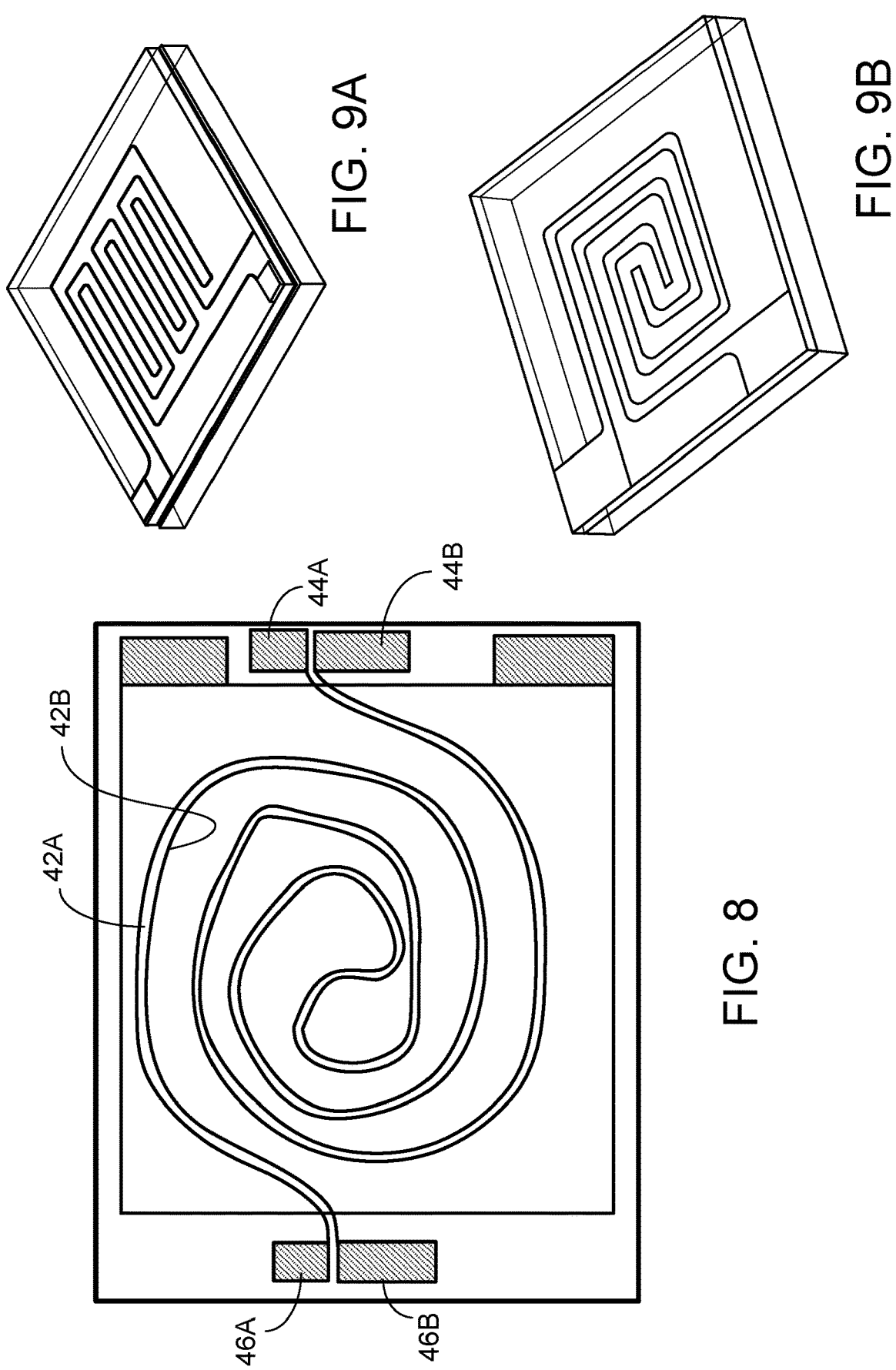

LIGHT EMITTING MODULE INCLUDING ENHANCED EYE-SAFETY FEATURE

FIELD OF THE DISCLOSURE

This disclosure relates to light emitting modules that include enhanced an eye-safety feature.

BACKGROUND

New features are being added to smart phones, tablets and other portable computing devices that include technologies to record three dimensional images, sense motion and/or gestures. Digital recording methods use various types of miniature illuminators, which interact with cameras to record dynamical events in three dimensional regions. These illuminators can be of various forms and deliver different types of functions. Some illuminate a wide area with very short pulses for Light Detection and Ranging (LIDAR) type measurements recording time of flight information. Other illuminators are pulsed or continuous wave (CW), and project structured light patterns onto a scene. The digital camera records an image of the structured light pattern, and software algorithms are used to determine three-dimensional scene information from modifications in the patterned image.

One technology that is suitable for miniature illuminators is high power vertical cavity surface emitting laser (VCSEL) devices and array devices. These devices can be pulsed with very fast rise times suitable for time-of-flight applications. They are small, but produce high power laser beams with efficient electro-optic conversion. However, various optical components (e.g., an optical diffuser) can be placed in the beam path to modify the beam properties for the specific application.

The optical output power of a bare VCSEL typically can, in some cases, be so high that it may cause damage to a person's eye or skin in the event the quality of the optical component is compromised. Thus, it is important to ensure that the high power laser illuminators meet laser safety regulations when operated in the portable computing devices. For example, the illuminator may be part of an assembly that, under normal operating conditions, maintains eye-safe operation by preventing a person from getting too close to the illuminator. However, in some cases, damage (e.g., cracks) to the optical structure that modifies the output beam for safe operation, or the presence of moisture or chemical contamination on the optical structure, may result in safety hazards. Likewise, if the optical structure were to fall off or be removed, safety could be compromised.

SUMMARY

The present disclosure describes illumination modules that, in some instances, have improved safety features.

For example, in one aspect, the disclosure describes a module including a housing, a light source disposed in the housing and operable to produce light having a wavelength, an optical component disposed over the light source so as to intersect a path of light produced by the light source, and a first electrically conductive trace on a surface of the optical component.

Some implementations include one or more of the following features. For example, in some instances, the first electrically conductive trace is composed of a material (e.g., ITO) that is transparent to the wavelength of light produced by the light source. In some implementations, the light source includes a VCSEL or an array of VCSELs. The optical light source can include, for example, an optical diffuser.

In some cases, the first electrically conductive trace is disposed on a surface of the optical component facing away from the light source. The first electrically conductive trace can be coupled electrically, for example, to first electrical contacts that are disposed at a first side of the module, the first side being opposite a second side of the module through which light from the light source is arranged to exit. The first electrically conductive trace also may be coupled electrically to second electrical contacts disposed adjacent the second side of the module, wherein the second electrical contacts are coupled electrically to the first electrical contacts by leads extending along outer sidewalls of the housing or through sidewalls of the housing.

Some implementations include a second electrically conductive trace on the surface of the optical component. The first and second electrically conductive traces are, in some instances, coupled capacitively to one another. In some cases, each of the first and second electrically conductive traces is coupled electrically to a respective electrical contact disposed at a first side of the module, the first side being opposite a second side of the module through which light from the light source is arranged to exit. In some implementations, each of the first and second electrically conductive traces is coupled electrically to a respective pair of electrical contacts disposed at a first side of the module, the first side being opposite a second side of the module through which light from the light source is arranged to exit.

In another aspect, the disclosure describes an apparatus that includes a light source operable to produce light having a wavelength, an optical component disposed over the light source so as to intersect a path of light produced by the light source, and at least one electrically conductive trace on a surface of the optical component. A drive controller is operable to regulate optical output power of the light source. The at least one electrically conductive trace is coupled electrically to the drive controller, which is operable to monitor an electrical characteristic of the at least one electrically conductive trace, and to reduce the optical output power of the light source if a value of the electrical characteristic changes by more than a threshold amount, is outside a specified range, or is indicative of a possible eye-safety hazard.

In some instances, the drive controller is operable to turn off the optical output power of the light source if the value of the electrical characteristic changes by more than the threshold amount or is outside the specified range. The electrical characteristic can include, for example, at least one of resistance or electrical current. In some cases, the at least one electrically conductive trace includes a first electrically conductive trace and a second electrically conductive trace, the first and second electrically conductive traces being coupled capacitively to one another. In such cases, the electrical characteristic can include, for example, a capacitance.

The apparatus also can include a printed circuit board, wherein a module housing the light source is mounted electrically to the printed circuit board, and the drive controller also is mounted electrically to the printed circuit board. In some instances, the printed circuit board is disposed in a portable computing device (e.g., a smart phone).

Other aspects, features and advantages will be readily apparent from the following detailed description, the accompanying drawings and the claims.

BRIEF DESCRIPTION OF THE DRAWINGS

FIG. 8 shows an example including multiple traces on a surface of an optical component.

FIGS. 9A and 9B show examples of a capacitive structure including two traces.

DETAILED DESCRIPTION

The present disclosure describes illumination modules and techniques to facilitate detection of an abnormality that might cause an eye-safety hazard or other risk. In general, detection of the abnormality can be implemented by providing one or more electrically conductive traces on a surface of an optical component that is disposed over the light emitter and is operable to modify the characteristics of the output beam(s). The electrically conducting trace(s) can be configured such that various modifications to the optical component cause a change in an electrical characteristic (e.g., electrical continuity, capacitance and/or electrical resistivity) of the trace that can be monitored by processing circuitry. In appropriate circumstances (e.g., if a detected change in the electrical characteristic indicates there may danger to eye or skin safety), the processing circuitry can turn off or otherwise regulate (e.g., reduce) the optical power output of the light emitter.

Figure 1:
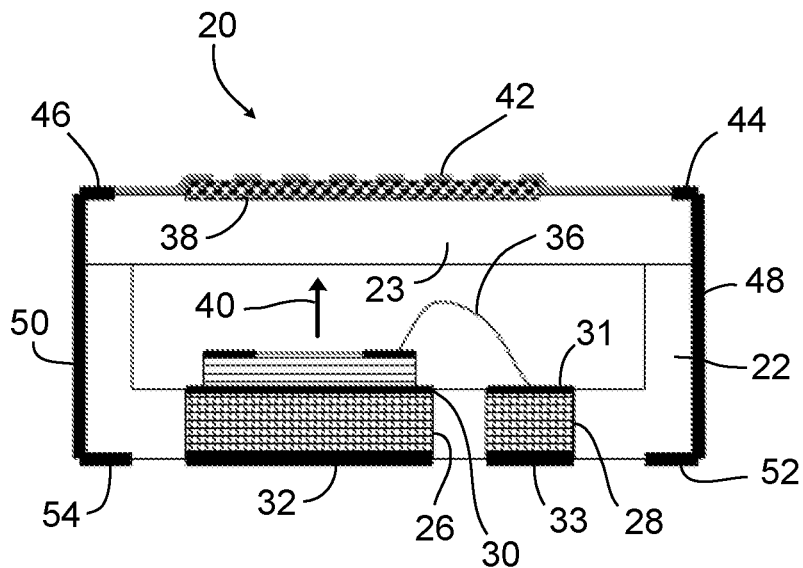
FIG. 1 is a cross-sectional view of a module including a conductive trace on a surface of an optical component.
Figure 2:
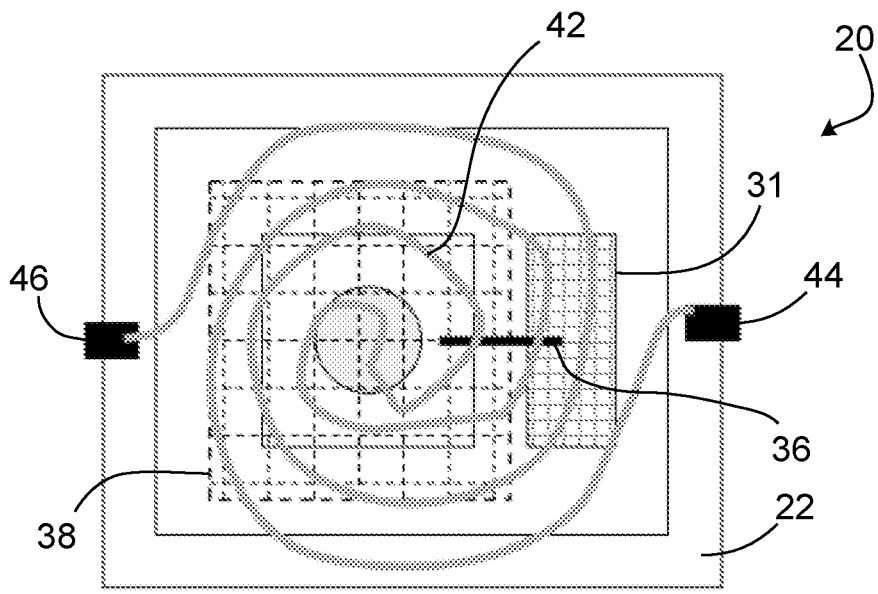
FIG. 2 is a top view of the module of FIG. 1.

FIGS. 1 and 2 illustrate an example of a illuminator module 20 in accordance with the present disclosure. A molded package housing 22 has a cavity in which a light source 24 is mounted. In the following discussion, it is assumed that the light source 24 includes a VCSEL. In some implementations, the light source 24 includes an array of VCSELs. Further, in some instances, the light source 24 includes one or more light emitting diodes (LEDs), infra-red (IR) LEDs, organic LEDs (OLEDs), or infra-red (IR) lasers.

The housing 22 has conductive feedthroughs 26, 28 with pads 30, 31 on the inside for the VCSEL, and pads 32, 33 on the outside for surface mount soldering to a printed circuit board (PCB) or other substrate. In this example, the light source 24 is directly bonded to one of the pads 30 using solder or similar electrically conducting bonding material. This provides one electrical contact (e.g., a cathode) as well as providing thermal conducting path. A second electrical contact (e.g., an anode) can be made to the light source 24 using wire bonding 36 to the second pad 31. If the light source 24 (e.g., a VCSEL array) has multiple contacts on the non-emitting side, then corresponding multiple pads can be used for soldering the VCSEL array in the package.

An optical component 38 is disposed over the light source 24 so as to intersect the path of light beam(s) produced by the light source. The optical component 38 can include, for example, an optical diffuser, a lens, a microlens array, a refractive or diffractive optical element, a diffuser, a spectral filter, a polarizing filter, and/or some other optical structure operable to modify the optical characteristics of the VCSEL output beam(s) 40. The optical component 38 can be attached, for example, to a cover glass 23.

As further shown in FIGS. 1 and 2, at least one electrically conductive trace 42 is provided on a surface of the optical component 38. In the illustrated example of FIGS. 1 and 2, the trace 42 is formed of an electrically conductive material that is substantially transparent to the wavelength(s) of light produced by the light source 24. For example, in some implementations, the trace 42 is composed of indium tin oxide (ITO). In other instances, the trace 42 can be composed of another substantially transparent and electrically conductive material. As shown in FIGS. 1 and 2, the trace 42 has a spiral shape. However, other shapes may be appropriate for some implementations. Further, although the trace 42 is shown as being on the outer surface of the optical component 38 that faces away from the light source 24, in some cases, the trace can be on the surface of the optical component that faces the light source 24.

Figure 3:
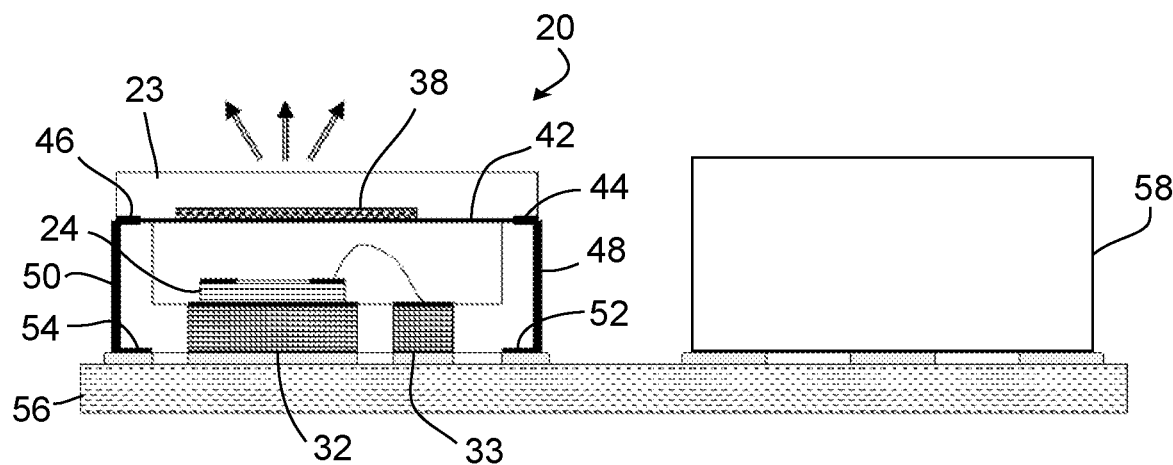
FIG. 3 is a cross-section view of the module and controller mounted on a printed circuit board.

The trace 42 is electrically connected to electrically conductive top contacts 44, 46 on the same side of the housing 22 as the trace. The top contacts 44, 46 are connected by respective electrically conductive leads 48, 50 extending along respective sides of the housing 22 to respective bottom contacts 52, 54 on the same side of the housing 22 as the contacts 32, 33. The bottom contacts 52, 54 can be connected (e.g., by surface mount soldering) to a PCB 56 as shown in FIG. 3.

Figure 4:
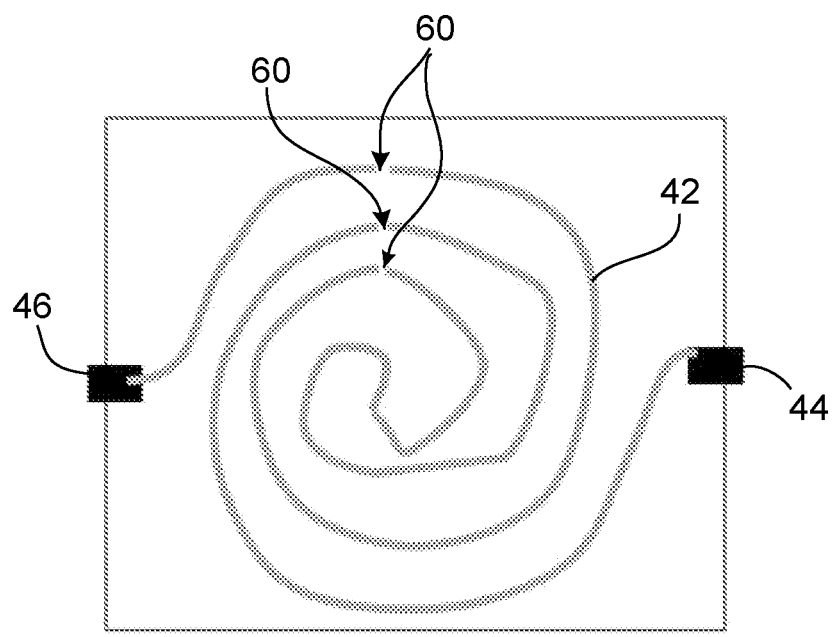
FIG. 4 illustrates an example of damage to the trace.

The trace 42, together with the leads 48, 50, can form part of an electrical circuit that that is connected, for example, by way of the PCB 56, to a VCSEL current driver controller or other electronic control device 58. The VCSEL current driver controller 58, which can be implemented, for example, as an integrated circuit in the form of a semiconductor chip, can be surface mount soldered to the printed circuit board 56. The controller 58 is operable to monitor an electrical characteristic of the trace 42 (e.g., current flowing through the trace or resistance). If the characteristic changes by more than a specified amount (e.g., more than a specified threshold)—or if the value of the electrical characteristic is outside a specified range—then the controller 58 turns off or otherwise regulates (e.g., reduces) the optical output produced by the light source 24. For example, the controller 58 can be operable to measure the continuity in the conductivity of the trace 42. As shown in FIG. 4, if mechanical or other damage occurs to the optical component such that one or more breaks 60 appear in the trace 42, the break(s) would cause a change in the resistance or conductivity, which can be detected by the controller 58.

Figure 5:
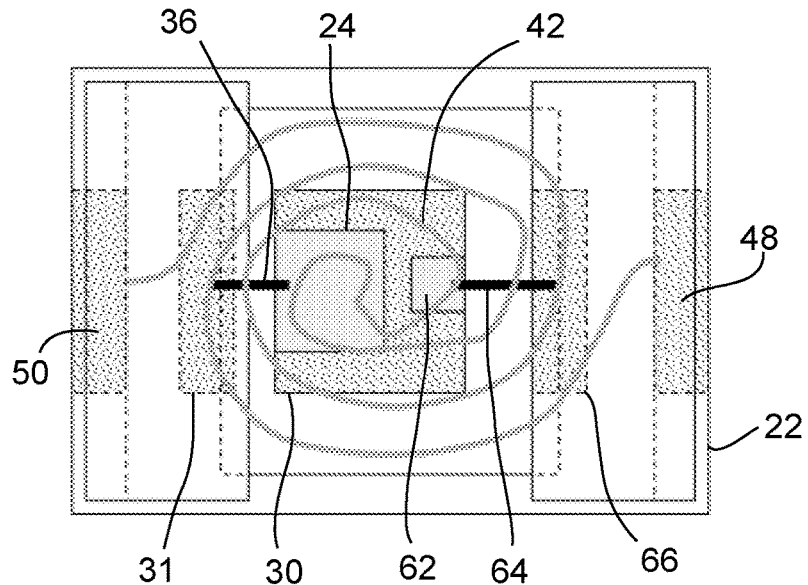
FIG. 5 is a cross-sectional view of another module including a conductive trace on a surface of an optical component.

In some cases, instead of extending along outer surfaces of the housing 22, the electrical leads 48, 50 can be formed within the walls of the housing, as shown for example in FIG. 5. In some instances, the module also may include a photodetector chip 62 electrically connected, for example, by a wire bond 64, to a pad 66. The photodetector chip 62 can be used, for example, to monitor the amount of light being emitted by the light source 24 or to sense an amount of light reflected by an object outside the module when light from the light source 24 is incident on the object.

Figure 6:
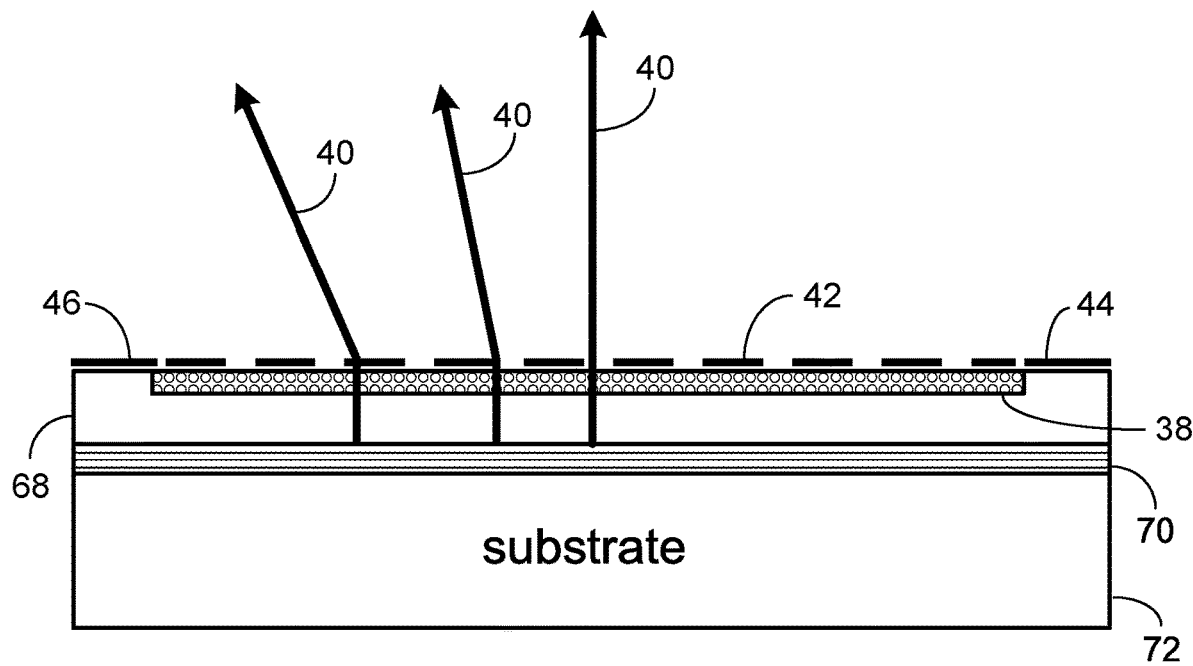
FIG. 6 illustrates an example of a VCSEL device including an integrated optical component and conductive trace.

The techniques described here can be applied, for example, to modules in which the light source is a top-emitting VCSEL, a bottom-emitting VCSEL or an array of such VCSELs. Further, the techniques can be applied to implementations in which the optical component 38 is separate from the light source 24 (as in FIGS. 1 and 3) as well as to implementations in which the optical component is integrated with the VCSEL device. An example of the latter case is illustrated in FIG. 6, which shows an ITO or other conductive trace 42 on the surface of an optical component 38 (e.g., a microlens array). In this example, the optical component 38 is disposed on a transparent semiconductor epitaxial layer or dielectric 68 that, in turn, is disposed on epitaxial layers 70 for the array of VCSELs 24. The epitaxial layers for the array of VCSELs 24 can be grown on and supported by a substrate 72. FIG. 6 also shows examples of the beams of light 40 produced by the VCSELs 24 and passing through the optical component 38 and the conductive trace 42.

Figure 7A:
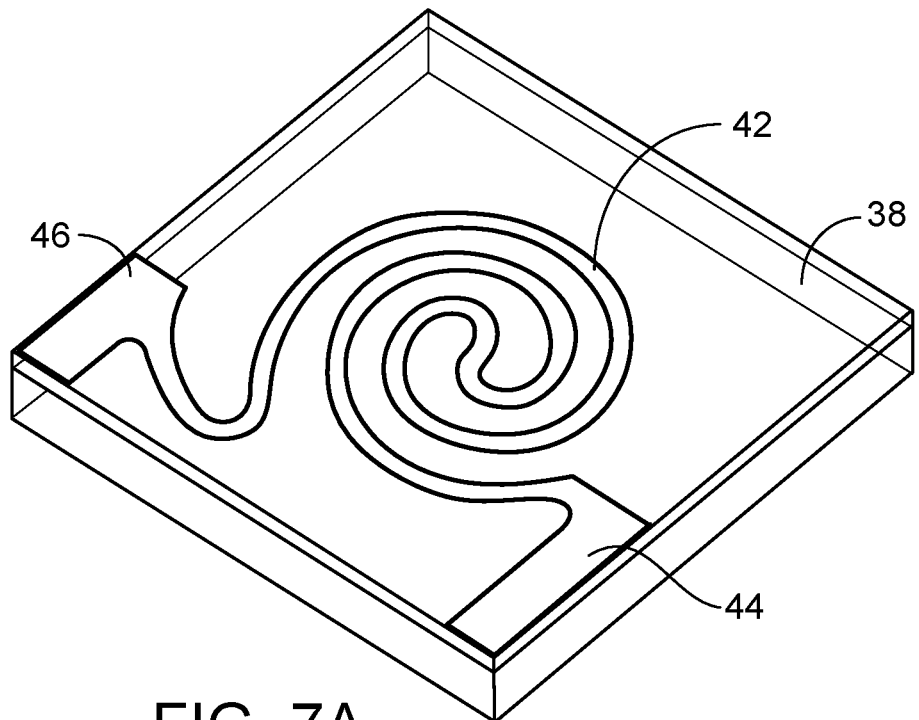
FIGS. 7A and 7B illustrate examples of single trace.
Figure 7B:
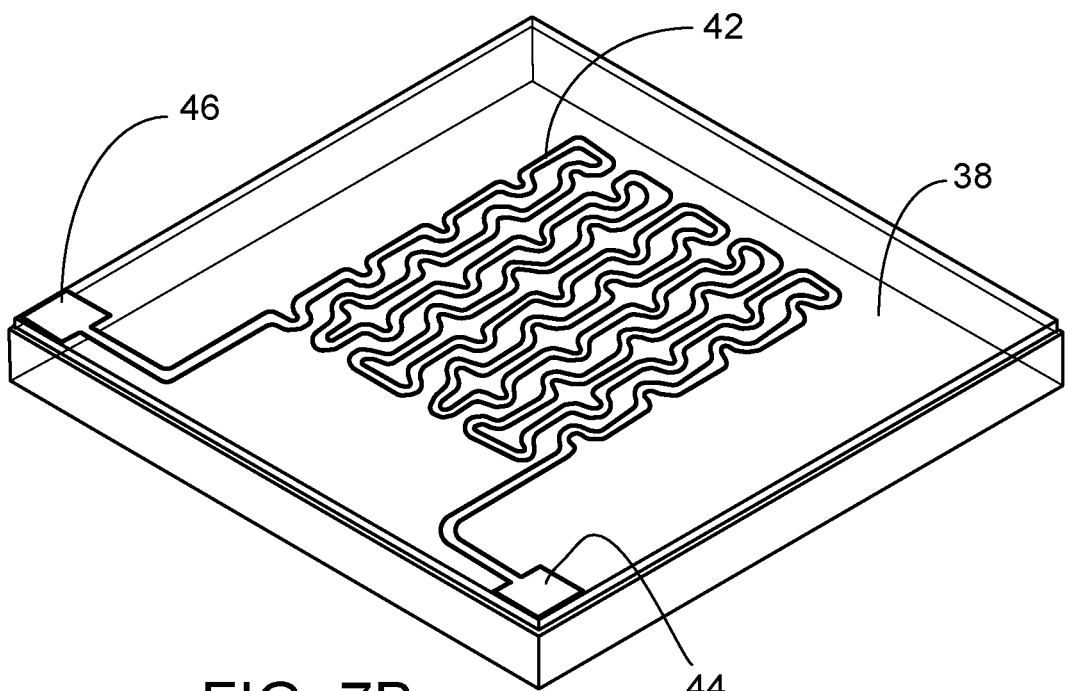

As noted above, the trace 42 can have any of a wide range of shapes. FIGS. 7A and 7B illustrate particular examples for the trace, but other shapes are possible as well. The area of the optical component's surface covered by the trace 42 can vary depending on the application, but in general should be sufficient to permit detection of damage to, or dislodging of, the optical component that, if not addressed, could result in the module operating in a mode that is not eye-safe.

The foregoing examples illustrate a single trace 42, which can be used for detecting changes, for example, in the continuity of current flow through, or resistance of, the trace. In some implementations, as shown in FIG. 8, multiple traces 42A, 42B can be provided sufficiently close to one another on the surface of the optical component so as to form a capacitive structure. Each of the traces 42A, 42B can be connected electrically to one or more respective contacts. For example, a first trace 42A can be connected to contacts 44A and 46A, whereas a second trace 42B can be connected to contacts 44B and 46B. Each of the contacts 44A, 46A, 44B, 46B can be connected electrically (e.g., via leads, additional contacts and a PCB) to the VCSEL current driver controller which can monitor both the resistance of each trace 42A, 42B individually, as well as the capacitance between the two traces 42A, 42B. In some implementations, it may be unnecessary to monitor the conductivity of each trace 42A 42B independently. In such cases, each trace 42A, 42B can be connected electrically to a single respective contact rather than two contacts. Thus, the first trace 42A may be connected only to one top contact (e.g., 44A or 46A), and the second trace 42B may be connected only to one top contact (e.g., 44B or 46B). Such an arrangement still can allow the VCSEL current driver controller to monitor the capacitance between the two traces 42A, 42B. If the capacitance changes by more than a specified threshold—or if the value of the capacitance is outside a specified range—the change may indicate that mechanical, chemical, moisture or other damage has occurred to the optical component (or that the optical component has been dislodged from its proper position) and that the module might operate in an unsafe mode. In response, the VCSEL current driver controller can turn off or otherwise regulate (e.g., reduces) the optical power output produced by the light source 24.

As shown in FIGS. 9A and 9B, the traces 42A, 42B can be arranged in any of a range of shapes (e.g., spiral or interdigitated).

Figure 10A:
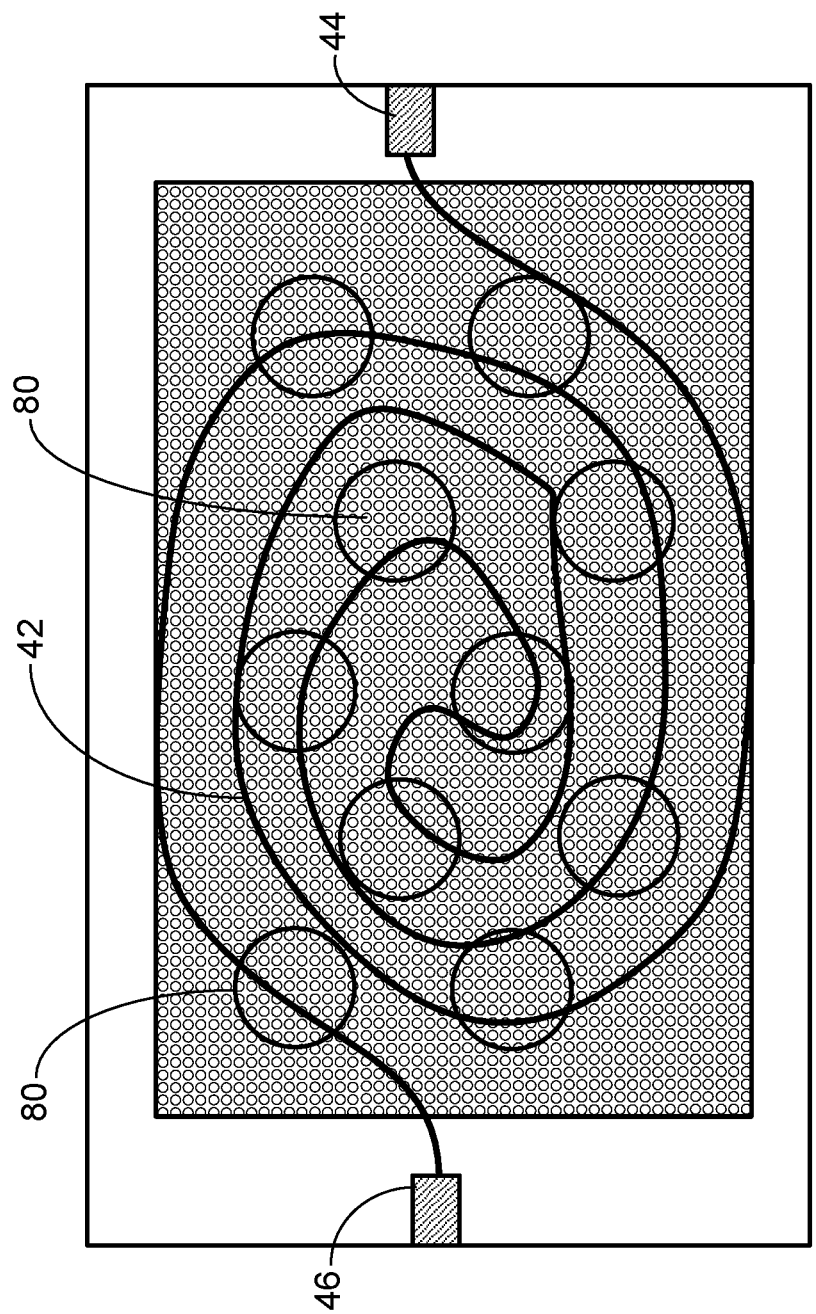
FIGS. 10A and 10B illustrate examples of traces composed of a transparent material.
Figure 10B:
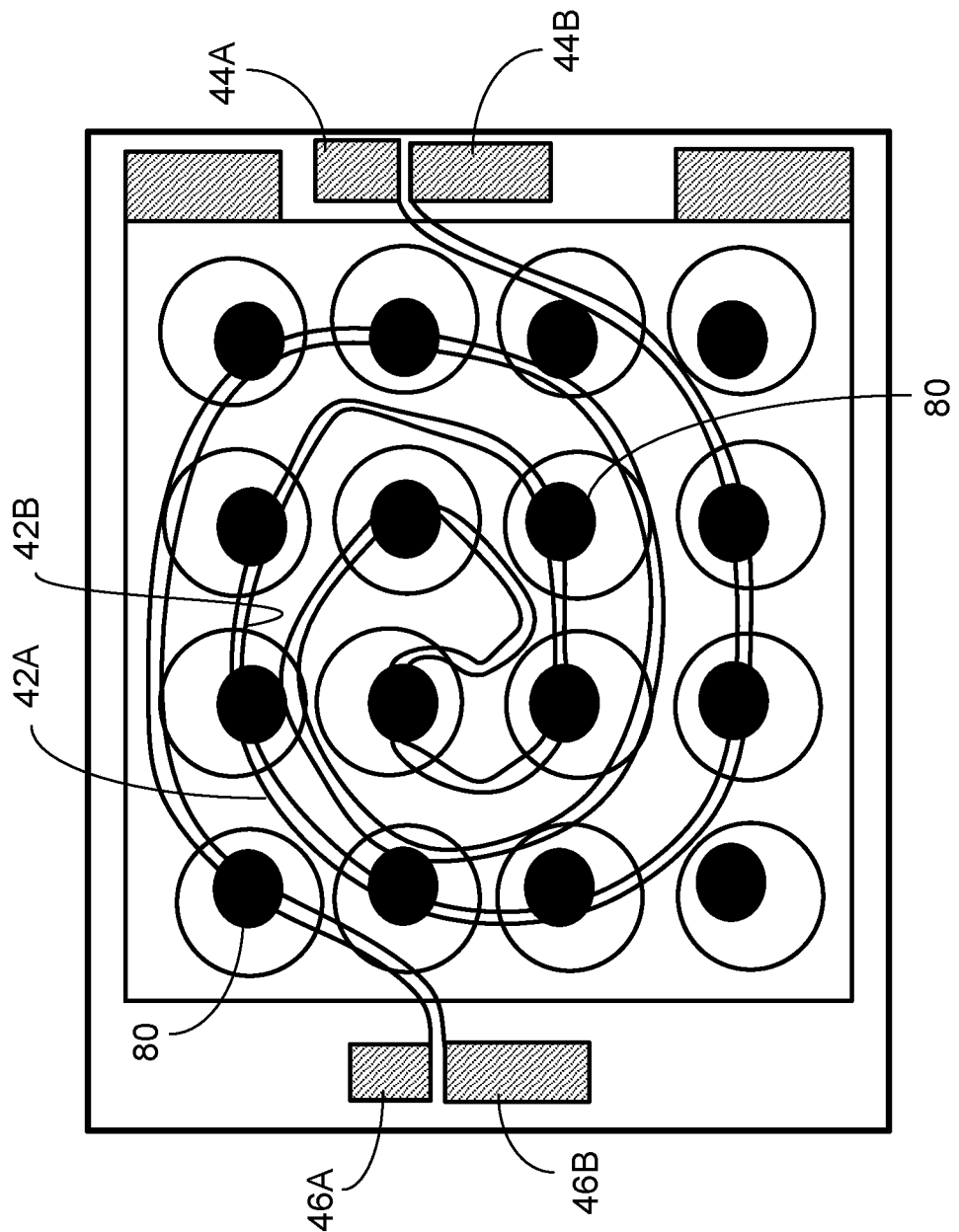

As discussed above, in some implementations it is advantageous to use a material (e.g., ITO) that is transparent to the wavelength(s) of light produced by the light source 24. As shown in FIGS. 10A, 10B, using transparent traces 42, 42A, 42B can allow the traces, in some cases, to be disposed directly over the VCSELs 80 such that the traces are directly in, or close to, the path(s) of the VCSEL beam(s). Further, this can be accomplished in some instances without adversely impacting the optical characteristics of the beams.

Figure 11:
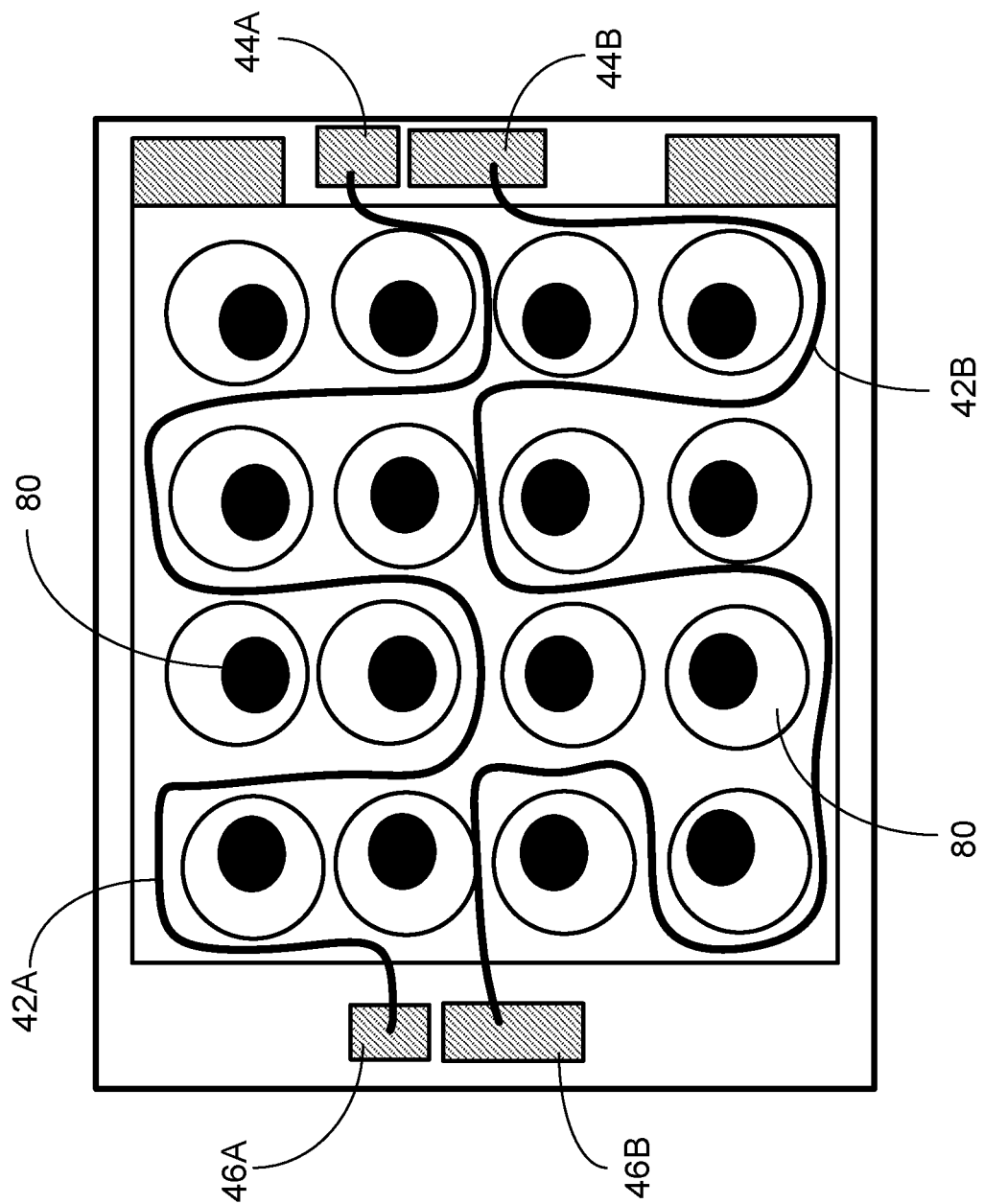
FIG. 11 illustrates an example of traces composed of an opaque material.

Although forming the trace(s) 42 of a material that is transparent, or at least substantially transparent, to the wavelength(s) of light produced by the light source 24 can be advantageous in some applications, in other implementations, the trace(s) 42 need not be transparent, but instead may be opaque to the wavelength(s) of light produced by the light source 24. For example, as shown in FIG. 11, if the contour of the traces 42A, 42B avoid the emission paths of light emitted by the VCSELs 80, the traces can be composed of a conductive material that is opaque to the wavelength(s) of light produced by the VCSELs 80.

The illuminator modules described above can be surface mount soldered to a printed circuit board used in a smart phone, tablet or other portable computing host device. The electrical connections provide both activation for the light source 24 and the safety signals from the conductive trace(s) 42 on the surface of the optical component 38. In some implementations, the illuminator package can be assembled at the same time, and by the same processes, as the other electrical components of the host system.

In general, the foregoing modules can be used in a wide range of applications such as LIDAR, proximity sensing, 3D sensors and cameras, automotive sensing, and others.

Various modifications will be readily apparent and can be made to the foregoing examples. Features described in connection with different embodiments may be incorporated into the same implementation in some cases, and various features described in connection with the foregoing examples may be omitted from some implementations. Thus, other implementations are within the scope of the claims.

What is claimed is:

1. A module comprising:
    a housing;
    a light source disposed in the housing and operable to produce light having a wavelength;
    an optical component disposed over the light source so as to intersect a path of light produced by the light source;
    first electrically conductive trace on a surface of the optical component; and
    a second electrically conductive trace on the surface of the optical component,
    wherein the first electrically conductive trace and the second electrically conductive trace are coplanar and are congruently curved.

2. The module of claim 1 wherein the first electrically conductive trace is composed of a material that is transparent to the wavelength of light produced by the light source.

3. The module of claim 2 wherein the first electrically conductive trace is composed of ITO.

4. The module of any one of claim 1 wherein the first electrically conductive trace is disposed on a surface of the optical component facing away from the light source.

5. The module of any one of claim 1 wherein the optical light source includes an optical diffuser.

6. The module of any one of claim 1 wherein the light source includes a VCSEL or an array of VCSELs.

7. The module of claim 1 wherein the first electrically conductive trace is coupled electrically to first electrical contacts that are disposed at a first side of the module, the first side being opposite a second side of the module through which light from the light source is arranged to exit.

8. The module of claim 7 wherein the first electrically conductive trace is coupled electrically to second electrical contacts disposed adjacent the second side of the module, wherein the second electrical contacts are coupled electrically to the first electrical contacts by leads extending along outer sidewalls of the housing.

9. The module of claim 7 wherein the first electrically conductive trace is coupled electrically to second electrical contacts disposed adjacent the second side of the module, wherein the second electrical contacts are coupled electrically to the first electrical contacts by leads extending through sidewalls of the housing.

10. The module of claim 1 including an array of VCSELs.

11. The module of claim 10 wherein each of the first and second electrically conductive traces is coupled electrically to a respective electrical contact disposed at a first side of the module, the first side being opposite a second side of the module through which light from the light source is arranged to exit.

12. The module of claim 10 wherein each of the first and second electrically conductive traces is coupled electrically to a respective pair of electrical contacts disposed at a first side of the module, the first side being opposite a second side of the module through which light from the light source is arranged to exit.

13. The module of claim 1,
wherein the first electrically conductive trace and the second electrically conductive trace each have a spiral shape portion.

14. The module of claim 1, wherein the first electrically conductive trace and the second electrically conductive trace are interdigitated.

15. An apparatus comprising:
a light source operable to produce light having a wavelength;
an optical component disposed over the light source so as to intersect a path of light produced by the light source; and
at least one electrically conductive trace on a surface of the optical component, wherein the at least one electrically conductive trace includes a first electrically conductive trace and a second electrically conductive trace, the first and second electrically conductive traces being coupled capacitively to one another, wherein the first electrically conductive trace and the second electrically conductive trace are coplanar and are congruently curved; and
a drive controller operable to regulate optical output power of the light source,
wherein the at least one electrically conductive trace is electrically coupled to the drive controller, the drive controller being operable to:
monitor an electrical characteristic of the at least one electrically conductive trace, and
reduce the optical output power of the light source if a value of the electrical characteristic changes by more than a threshold amount or is outside a specified range.

16. The apparatus of claim 15 wherein the drive controller is operable to turn off the optical output power of the light source if the value of the electrical characteristic changes by more than the threshold amount or is outside the specified range.

17. The apparatus of claim 15 wherein the electrical characteristic includes at least one of resistance or electrical current.

18. The apparatus of claim 15 including a printed circuit board, wherein a module housing the light source is mounted electrically to the printed circuit board, the drive controller also being mounted electrically to the printed circuit board.

19. The apparatus of claim 18 wherein the printed circuit board is disposed in a portable computing device.

20. The apparatus of claim 18 wherein the printed circuit board is disposed in a smart phone.

21. An apparatus comprising:
a light source operable to produce light having a wavelength;
an optical component disposed over the light source so as to intersect a path of light produced by the light source; and
at least one electrically conductive trace on a surface of the optical component, wherein the at least one electrically conductive trace includes a first electrically conductive trace and a second electrically conductive, wherein the first electrically conductive trace and the second electrically conductive trace are coplanar and are congruently curved; and
a drive controller operable to regulate optical output power of the light source, wherein the at least one electrically conductive trace is electrically coupled to the drive controller, the drive controller being operable to:
monitor an electrical characteristic of the at least one electrically conductive trace, and
reduce the optical output power of the light source if a value of the electrical characteristic is indicative of a possible eye-safety hazard.

* * * * *